(12) United States Patent
Sung et al.

(10) Patent No.: US 8,031,143 B2
(45) Date of Patent: Oct. 4, 2011

(54) DISPLAY DEVICE WITH FLEXIBLE MEMBERS DISTRIBUTING REFERENCE VOLTAGE TO ATTACHED CIRCUIT BOARD

(75) Inventors: Si-duk Sung, Seoul (KR); Byung-sik Koh, Gwangmyeong-si (KR)

(73) Assignee: Samsung Electronics Co., Ltd. (KR)

( * ) Notice: Subject to any disclaimer, the term of this patent is extended or adjusted under 35 U.S.C. 154(b) by 1078 days.

(21) Appl. No.: 11/774,736

(22) Filed: Jul. 9, 2007

(65) Prior Publication Data
US 2008/0012474 A1   Jan. 17, 2008

(30) Foreign Application Priority Data
Jul. 11, 2006   (KR) .................. 10-2006-0064914

(51) Int. Cl.
*G09G 3/32* (2006.01)
(52) U.S. Cl. ........................................ 345/82
(58) Field of Classification Search .......... 345/82
See application file for complete search history.

(56) References Cited

U.S. PATENT DOCUMENTS

| | | | | |
|---|---|---|---|---|
| 5,670,994 | A * | 9/1997 | Kawaguchi et al. | 345/206 |
| 6,002,388 | A * | 12/1999 | Seffernick et al. | 345/161 |
| 2005/0046777 | A1 * | 3/2005 | Moon | 349/149 |
| 2005/0088106 | A1 * | 4/2005 | Suh | 315/169.3 |
| 2005/0110023 | A1 * | 5/2005 | Lee et al. | 257/72 |
| 2005/0190175 | A1 * | 9/2005 | Kim et al. | 345/204 |
| 2005/0205888 | A1 * | 9/2005 | Miyasaka | 257/99 |
| 2006/0017055 | A1 * | 1/2006 | Cropper et al. | 257/77 |
| 2006/0017665 | A1 * | 1/2006 | Ko et al. | 345/76 |
| 2006/0092121 | A1 * | 5/2006 | Watanabe et al. | 345/98 |
| 2006/0231837 | A1 * | 10/2006 | Wuchse et al. | 257/59 |

FOREIGN PATENT DOCUMENTS

| | | |
|---|---|---|
| JP | 04245226 | 9/1992 |
| JP | 2002056969 | 2/2002 |
| JP | 2005173579 | 6/2005 |
| KR | 1020020075556 | 10/2002 |

* cited by examiner

*Primary Examiner* — Richard Hjerpe
*Assistant Examiner* — Jeffrey Parker
(74) *Attorney, Agent, or Firm* — Cantor Colburn LLP

(57) ABSTRACT

A display device includes; an insulating substrate, a display element which defines a display region and includes an organic light emitting layer which is formed on the insulating substrate, a first circuit board disposed parallel with a first side of the insulating substrate, a reference voltage pad formed on a circumference of the display region and which is electrically connected to the display element, and a first flexible member which includes a first part which adheres to the first circuit board and a second part connected to the reference voltage pad along a second side of the face of the insulating substrate.

27 Claims, 17 Drawing Sheets

US 8,031,143 B2

DISPLAY DEVICE WITH FLEXIBLE MEMBERS DISTRIBUTING REFERENCE VOLTAGE TO ATTACHED CIRCUIT BOARD

This application claims priority to Korean Patent Application No. 2006-0064914, filed on Jul. 11, 2006, and all the benefits accruing therefrom under 35 U.S.C. §119, the contents of which in its entirety are herein incorporated by reference.

BACKGROUND OF THE INVENTION

1.) Field of the Invention

The present invention relates to a display device.

2.) Description of the Related Art

Recently, organic light emitting diode ("OLED") devices have attracted attention and interest in the industry of flat panel display devices because of their low-power requirements, light weight, slim shape, wide viewing angle, high-speed response, and other positive characteristics.

A display element of an OLED is supplied with a reference voltage such as a common voltage, a driving voltage or other voltages used to operate the OLED. The common voltage is supplied to a common electrode and the driving voltage is supplied to a power supply line.

As the size of the OLED increases, it becomes increasingly difficult to supply the common voltage and the driving voltage uniformly to a display region, resulting in undesirable bright and dark spots on the display.

One method of overcoming this trouble is to provide, a circuit board and a film to supply the common voltage and the driving voltage.

However, the foregoing method involves a complicated configuration of the OLED due to the additional circuit board and film which increases manufacturing costs.

BRIEF SUMMARY OF THE INVENTION

Accordingly, it is an aspect of the present invention to provide a display device having a simple configuration to apply a reference voltage to a display element.

The foregoing and/or other aspects, features and advantages of the present invention are achieved by providing an exemplary embodiment of a display device including; an insulating substrate, a display element which defines a display region and includes an organic light emitting layer which is formed on the insulating substrate, a first circuit board disposed parallel with a first side of the insulating substrate, a reference voltage pad formed on a circumference of the display region which is electrically connected to the display element, and a first flexible member which includes a first part which adheres to the first circuit board and a second part connected to the reference voltage pad along a second side of the face of the insulating substrate.

According to an exemplary embodiment of the present invention, the first side and the second side are substantially perpendicular to each other.

According to an exemplary embodiment of the present invention, the first flexible member is longer than the second side.

According to an exemplary embodiment of the present invention, the first side is longer than the second side.

Accordingly to an exemplary embodiment of the present invention, the flexible member receives a reference voltage from the first circuit board.

According to an exemplary embodiment of the present invention, the display device further includes; a second circuit board disposed parallel with a third side of the insulating substrate which is disposed opposite to the second side of the insulating substrate, and a second flexible member which includes a third part which adheres to the second circuit board and a fourth part connected to the reference voltage pad along a fourth side of the insulating substrate which is opposite to the first side of the insulating substrate.

According to an exemplary embodiment of the present invention, the reference voltage includes a common voltage and a driving voltage, the first flexible member applies one of the common voltage and the driving voltage to the reference voltage pad, and the second flexible member applies the other of the common voltage and the driving voltage to the reference voltage pad.

According to an exemplary embodiment of the present invention, the first flexible member includes a first sub-flexible member and a second sub-flexible member which are connected to the first circuit board, respectively.

According to an exemplary embodiment of the present invention, the first sub-flexible member is connected to a first end portion of the first circuit board, and the second sub-flexible member is connected to a second end portion of the first circuit board.

According to an exemplary embodiment of the present invention, the first sub-flexible member and the second sub-flexible member are disposed opposite to each other with the display region disposed therebetween.

According to an exemplary embodiment of the present invention, the reference voltage includes a common voltage and a driving voltage, the first sub-flexible member applies one of the common voltage and the driving voltage to the reference voltage pad, and the second sub-flexible member applies the other of the common voltage and the driving voltage to the reference voltage pad.

According to an exemplary embodiment of the present invention, the first flexible member includes; a conductive layer, a first insulating layer formed on a first surface of the conductive layer, and a second insulating layer formed on a second surface of the conductive layer, wherein a gap is formed in one of the first insulating layer and the second insulating layer whereby the first circuit board and the reference voltage pad are connected therethrough.

According to an exemplary embodiment of the present invention, the first flexible member includes; a conductive layer, a first insulating layer formed on a first surface of the conductive layer, and a second insulating layer formed on a second surface of the conductive layer, wherein at least one of the first part and the second part is not formed with one of the first insulating layer and the second insulating layer.

According to an exemplary embodiment of the present invention, a contact area between the second part of the first flexible member and the reference voltage pad increases with distance from the first part of the first flexible member.

According to an exemplary embodiment of the present invention, the first flexible member includes a first conductive layer and a second conductive layer which are electrically insulated from each other.

According to an exemplary embodiment of the present invention, a reference voltage comprises a common voltage and a driving voltage, the first conductive layer applies one of the common voltage and the driving voltage to the reference voltage pad, and the second conductive layer applies the other of the common voltage and the driving voltage to the reference voltage pad.

According to an exemplary embodiment of the present invention, the display device further comprises an encapsulation member formed on the display element, wherein a portion of the second part of the first flexible member is disposed on the encapsulation member.

According to an exemplary embodiment of the present invention, a light generated in the display element exits toward the insulating substrate.

According to an exemplary embodiment of the present invention, a light generated in the display element exits in a direction substantially opposite to the insulating substrate, and the second part of the first flexible member is bent in a direction substantially opposite to the exiting direction of light.

According to an exemplary embodiment of the present invention, the display device further includes an anisotropic conductive film disposed between the first part of the first flexible member and the first circuit board and between the second part of the first flexible member and the reference voltage pad.

According to an exemplary embodiment of the present invention, the display device further comprises a film member, wherein a first side of the film member is connected to the insulating substrate and a second side of the film member is connected to the circuit board.

The foregoing and/or other aspects, features and advantages of the present invention are achieved by providing an exemplary embodiment of a display device including; an insulating substrate, a display element formed on the insulating substrate, a circuit board disposed parallel with a first side of the insulating substrate, and a flexible member which includes a first part which receives a reference voltage from the circuit board and a second part which extends along a second side of the insulating substrate and which supplies the reference voltage to the display element.

According to an exemplary embodiment of the present invention, the first side and the second side are substantially perpendicular to each other.

According to an exemplary embodiment of the present invention, the flexible member is longer than the second side.

The foregoing and/or other aspects, features and advantages of the present invention are achieved by providing an exemplary embodiment of a display device including; an insulating substrate, a display element formed on the insulating substrate which defines a display region, a reference voltage pad formed on a circumference of the display region and electrically connected to the display element, and a flexible member which extends along a first side of the insulating substrate, is connected to the reference voltage pad to apply a reference voltage to the reference voltage pad, and is longer than the first side.

According to an exemplary embodiment of the present invention, the display device further comprises a circuit board disposed parallel with a second side of the insulating substrate, wherein a portion of the flexible member is connected to the circuit board and the flexible member receives the reference voltage from the circuit board.

According to an exemplary embodiment of the present invention, the first side and the second side of the insulating substrate are substantially perpendicular to each other.

BRIEF DESCRIPTION OF THE DRAWINGS

The above and/or other aspects, features and advantages of the present invention will become apparent and more readily appreciated from the following description of the exemplary embodiments, taken in conjunction with the accompanying drawings of which.

DETAILED DESCRIPTION OF THE INVENTION

Figure 1:
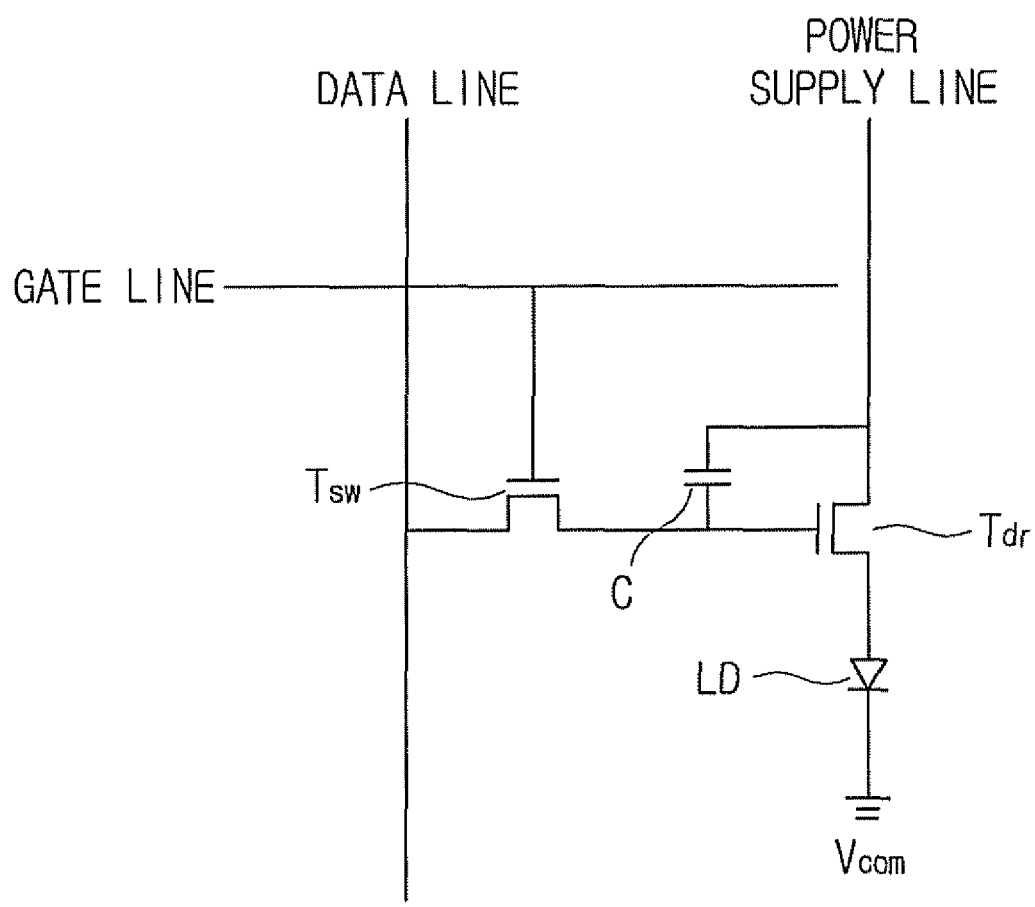
FIG. 1 is an equivalent circuit diagram of a first exemplary embodiment of a display device according to the present invention.

Reference will now be made in more detail to exemplary embodiments of the present invention, examples of which are illustrated in the accompanying drawings, wherein like reference numerals refer to like elements throughout. The embodiments are described below in order to explain the present invention by referring to the figures.

In the following description, if a layer is said to be formed 'on' another layer, then a third layer may be disposed between the two layers or the two layers may be in contact with each other. In other words, it will be understood that when an element such as a layer, film, region, or substrate is referred to as being "on" another element, it can be directly on the other element or intervening elements may also be present. Furthermore, a layer is said to be formed 'right on' another layer, it will be understood that the two layers are in contact with each other.

It will be noted that a 'reference voltage' denotes a common voltage and/or a driving voltage and a 'reference voltage pad' denotes a common voltage pad and/or a power supply pad.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Referring to FIG. 1, an exemplary embodiment of a pixel includes a plurality of signal lines. The signal lines include a gate line transmitting a scanning signal, a data line transmitting a data signal and a power supply line transmitting a driving voltage. The data line and the power supply line are disposed adjacent and parallel to each other. The gate line extends substantially perpendicularly to the data line and the power supply line.

Each pixel includes an organic light emitting element LD, a switching thin film transistor Tsw, a driving thin film transistor Tdr and a capacitor C.

The driving thin film transistor Tdr includes a control terminal, an input terminal and an output terminal. The control terminal is connected to the output terminal of the switching thin film transistor Tsw, the input terminal is connected to the power supply line, and the output terminal is connected to the organic light emitting element LD.

The organic light emitting element LD includes an anode connected to the output terminal of the driving thin film transistor Tdr and a cathode connected to a common voltage Vcom. The organic light emitting element LD emits light with variable intensity depending on an output current from the driving thin film transistor Tdr. A plurality of pixels is then able to display images using the light output by the light emitting element LD. The intensity of the current from the driving thin film transistor Tdr varies depending on a voltage between the control terminal and the output terminal thereof.

The switching thin film transistor Tsw includes a control terminal, an input terminal and an output terminal. The control terminal is connected to the gate line, the input terminal is connected to the data line, and the output terminal is connected to the control terminal of the driving thin film transistor Tdr. The switching thin film transistor Tsw transmits the data signal applied to the data line to the driving thin film transistor Tdr according to the scanning signal applied to the gate line.

The capacitor C is connected between the control terminal and the input terminal of the driving thin film transistor Tdr. The capacitor C is charged with the data signal input to the control terminal of the driving thin film transistor Tdr and maintains the data signal.

A first exemplary embodiment of a display device 1 will be described with reference to FIGS. 2 and 3. For clarity, a data driver 400, a gate driver 500, a driving voltage transmitting part 611, a common voltage transmitting part 622, a first flexible member 710 and a second flexible member 720 are not shown in FIG. 2 but are shown in FIG. 3.

Figure 2:
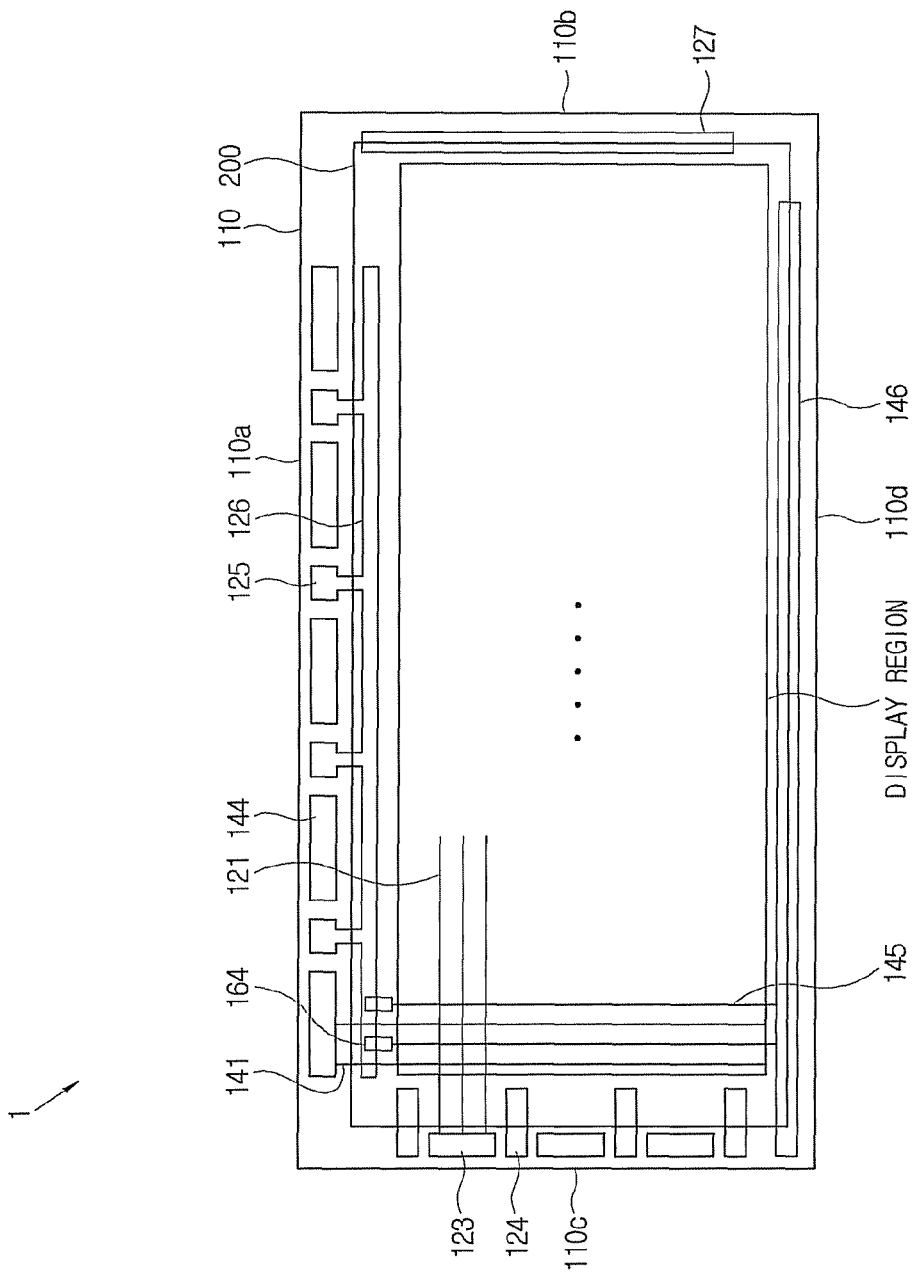
FIGS. 2 and 3 are top plan layout views of the first exemplary embodiment of a display device according to the present invention.
Figure 3:
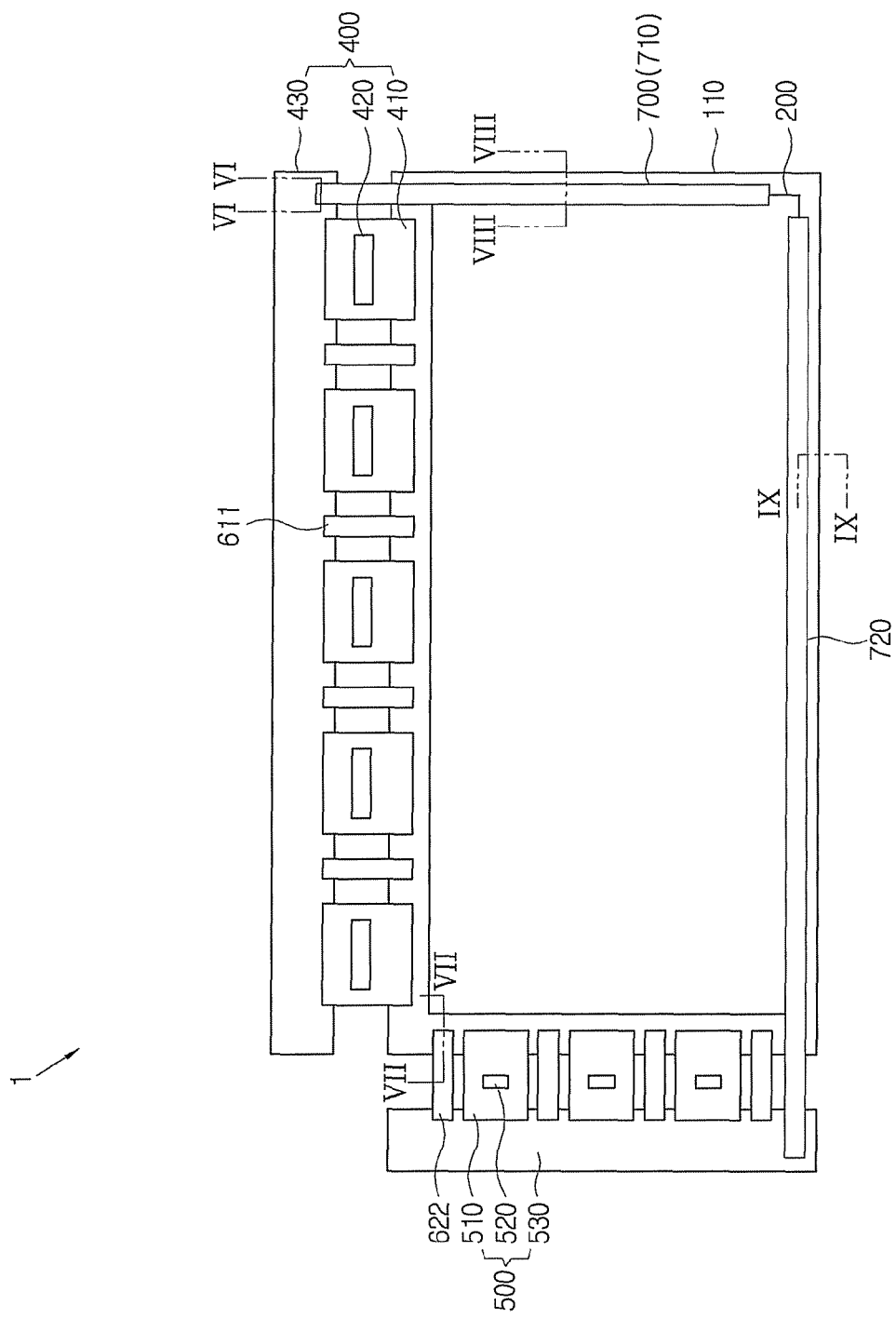

The following description with reference to FIGS. 2 and 3 centers on a non-display region.

The first exemplary embodiment of a display device 1 includes an insulating substrate 110, an encapsulation substrate 200 and a sealant 300 (see FIG. 7) to assemble the substrates 110 and 200.

The insulating substrate 110 includes a display region and a non-display region which surrounds the display region. In one exemplary embodiment the insulating substrate 110 has a rectangular shape and includes a first side 110a and a fourth side 110d which are relatively long and disposed opposite to each other and a second side 110b and a third side 110c which are relatively short and are disposed opposite to each other.

In the present exemplary embodiment a data pad 144 connected to the data driver 400 is provided in an upper region of the non-display region located along the first side 110a. The data pad 144 is connected to a data line 141 which extends to the display region.

A plurality of data pads 144 are provided and separated from each other at regular intervals. A first power supply pad 125 is disposed between the neighboring data pads 144. The first power supply pad 125 receives a driving voltage from the data driver 400 through the driving voltage transmitting part 611.

The first power supply pad 125 is connected to a driving voltage bar 126 disposed parallel with the gate line 121. A power supply line 145 is connected to the driving voltage bar 126 and extends parallel with the data line 141. In the present exemplary embodiment, the driving voltage bar 126 and the power supply line 145 are formed in different layers and are connected to each other through a driving bridge 164, exemplary embodiments of which are made of a transparent conductive material.

A gate pad 123 connected to the gate driver 500 is provided in a left portion of the non-display region located along the third side 110c. The gate pad 123 is connected to the gate line 121 which extends to the display region.

A plurality of gate pads 123 are separated from each other at substantially regular intervals. A first common voltage pad 124 is disposed between the neighboring gate pads 123. The first common voltage pad 124 receives a common voltage from the gate driver 500 through the common voltage transmitting part 622.

A second common voltage pad 127 extends lengthwise in a right region of the non-display region located along the second side 110b. The second common voltage pad 127 is connected to a common electrode 190 (see FIG. 7) to apply a common voltage thereto. In the present exemplary embodiment the second common voltage pad 127 is formed in the same layer as the gate line 121.

A second power supply pad 146 extends lengthwise in a lower region of the non-display region located along the second side 110d. The second power supply pad 146 is connected to the power supply line 145 to apply a driving voltage to the driving voltage line 145. The second power supply pad 146 is formed in the same layer as the data line 141.

The data driver 400 includes a flexible film 410, a data driving chip 420 and a data circuit board 430. The gate driver 500 includes a flexible film 510, a gate driving chip 520 and a gate circuit board 530. The data circuit board 430 extends parallel with the first side 110a, and the gate circuit board 530 extends substantially parallel with the third side 110c.

In the first exemplary embodiment, the second common voltage pad 127 is connected to a first flexible member 710 to receive the common voltage from the first flexible member 710. The second power supply pad 146 is connected to a second flexible member 720 to receive the driving voltage.

The first flexible member 710 extends substantially lengthwise along the second side 110b, and an end portion thereof is connected to the data circuit board 430. The second flexible member 720 extends substantially lengthwise along the fourth side 110d, and an end portion thereof is connected to the gate circuit board 530. The first flexible member 710 and the second flexible member 720 extend substantially perpendicularly to each other.

Figure 4:
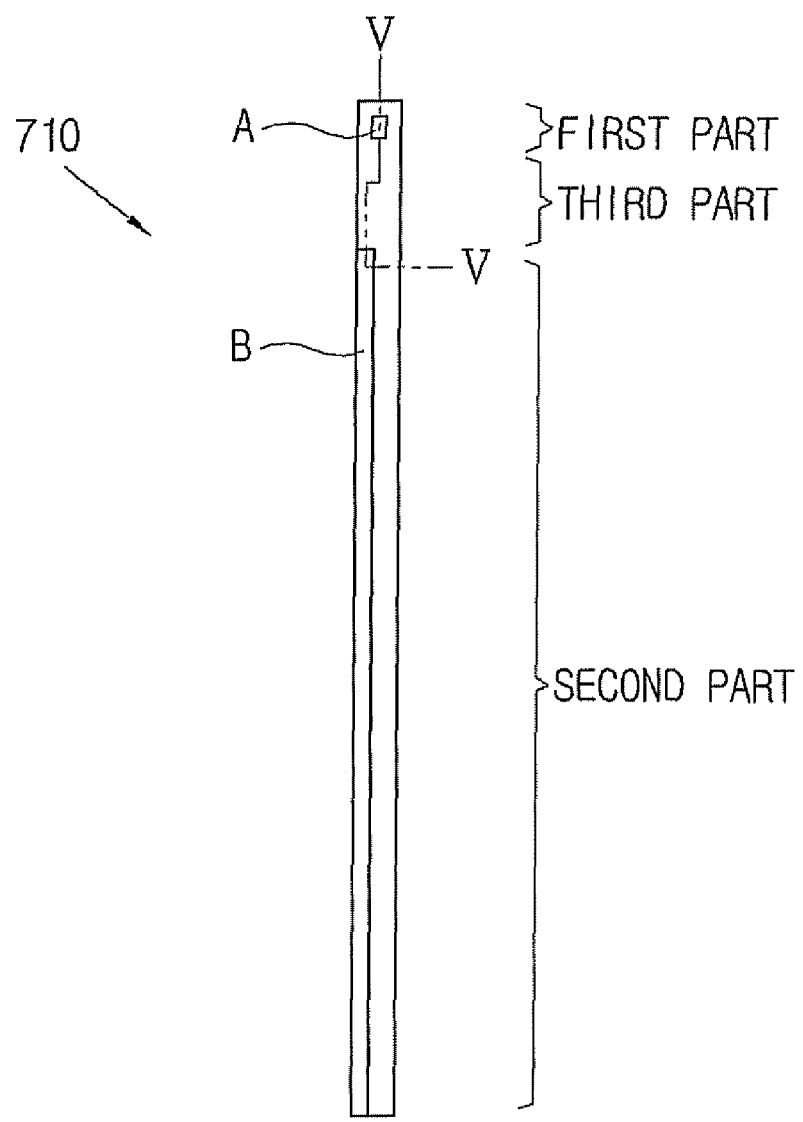
FIG. 4 is a rear view of an exemplary embodiment of a flexible member in the display device according to the present invention.

The structure of the first flexible member 710 will be described with reference to FIGS. 4 and 5.

The first flexible member 710 includes a first part, a second part and a third part. The first part is connected to the data circuit board 430, the second part is connected to the second common voltage pad 127, and the third part connects the first and the second parts.

Figure 5:
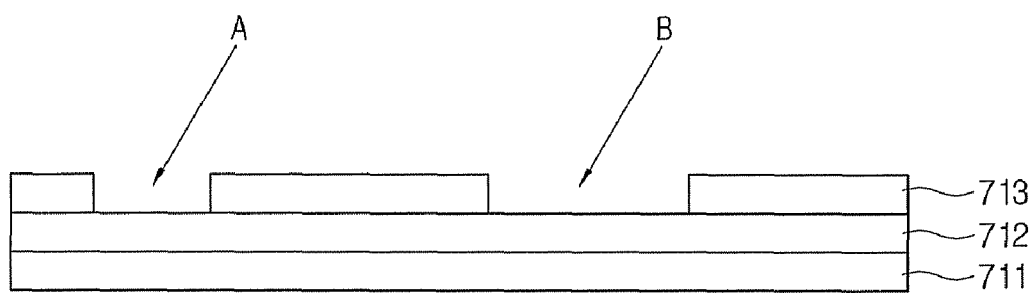
FIG. 5 is a cross-sectional view taken along line V-V in FIG. 4.

As shown in FIG. 5, the first flexible member 710 includes three layers including a conductive layer 712 disposed in the middle and first and second insulating layers 711 and 713, respectively. Exemplary embodiments of the conductive layer 712 may be made of metal having excellent conductivity such as copper or other similar materials, and exemplary embodiments of the first and second insulating layers 711 and 713 may be made of plastic.

The conductive layer 712 and the first insulating layer 711, wherein the first insulating layer is exposed to the outside, are formed throughout the first flexible member 710. The second insulating layer 713 facing the data circuit board 430 and the second common voltage pad 127 only partially covers the conductive layer 712 and is disposed on only a portion of the first flexible member 710. The conductive layer 712 is exposed through the second insulating layer 713 in a first region (A) where a portion of the second insulating layer 713 is removed, thereby electrically connecting the conductive layer 712 with the data circuit board 430. The conductive layer 712 is exposed in a second region (B_) where a portion of the second insulating layer 713 is removed, thereby electrically connecting the conductive layer 712 to the second common voltage pad 127. In one exemplary embodiment the regions (A) and (B) may be formed by removing portions of the second insulating layer 713. However, alternative exemplary embodiments include configurations wherein the regions may be formed by forming the second insulating layer so that it is not disposed on the regions (A) and (B).

Figure 6:
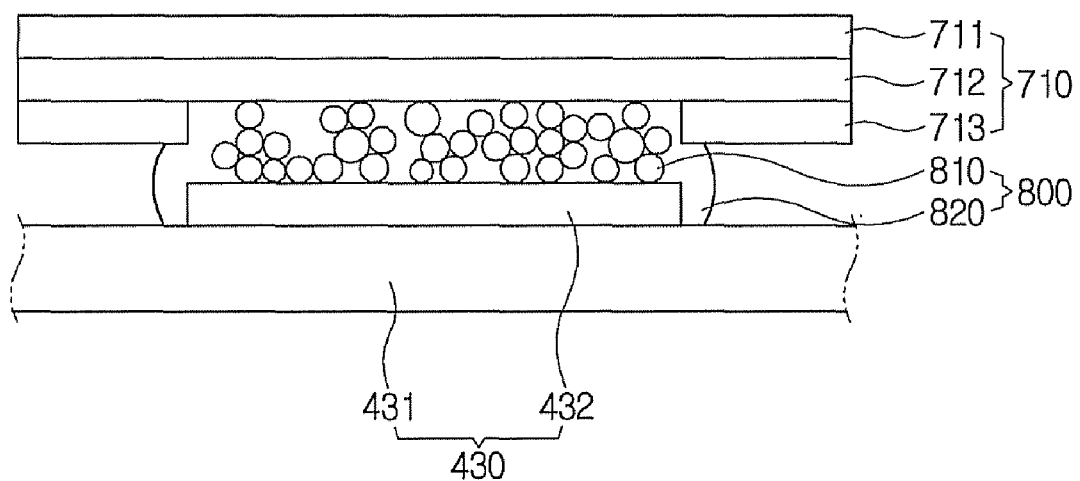
FIG. 6 is a cross-sectional view taken along line VI-VI in FIG. 3.

FIG. 6 is a cross-sectional view taken along line VI-VI in FIG. 3 which illustrates a connection between the first part of the first flexible member 710 and the data circuit board 430.

An anisotropic conductive film 800 is disposed between the first flexible member 710 and the data circuit board 430. Exemplary embodiments of the anisotropic conductive film 800 include conductive balls 810 and a resin layer 820. The conductive balls 810 are made of conductive material such as metal and contact with one another to form a conductive path. The resin layer 820 surrounds the conductive balls 810 and adheres the first flexible member 710 and the data circuit board 430.

The conductive layer 712 of the first flexible member 710 is exposed through a gap in the second insulating layer 713 to contact with the anisotropic conductive film 800. The data circuit board 430 includes a main board 431 and a lead 432 which applies a common voltage to the first flexible member 710, wherein the lead 432 contacts with the anisotropic conductive film 800.

The structure of the second flexible member 720 is similar to that of the first flexible member 710, and thus descriptions thereof will not be repeated. Furthermore, connection of the second flexible member 720 and the gate circuit board 530 is similar to that of the first flexible member 710 and the data circuit board 430, and thus descriptions thereof will not be repeated.

Next, a display region will be described with reference to FIGS. 2 and 7 to 9.

The gate line 121 and a gate electrode 122 are formed on the insulating substrate 110. Exemplary embodiments of the substrate 110 include an insulating material such as glass, quartz, ceramic or plastic. The gate line 121 and the gate electrode 122 are formed in the same metal layer where the gate pad 123, the first common voltage pad 124, the first power supply pad 125, the driving voltage bar 126 and the second common voltage pad 127 are formed in the non-display region. The gate line 121 is connected to the gate pad 123.

A gate insulating layer 131, exemplary embodiments of which may be made of silicon nitride ("SiNx") or other similar materials, is formed on the gate line 121 and the gate electrode 122.

A semiconductor layer 132, exemplary embodiments of which may be made of amorphous silicon, is formed on the gate insulating layer 131 above the gate electrode 122. An ohmic contact layer 133, exemplary embodiments of which are made of n+ hydrogenated amorphous silicon which is highly doped with n-type impurities, is formed on the semiconductor layer 132. The ohmic contact layer 133 is divided into two parts with the gate electrode 122 disposed therebetween.

The data line 141, a source electrode 142 and a drain electrode 143 are formed on the ohmic contact layer 133 and the gate insulating layer 131. The source electrode 142 and the drain electrode 143 are separated from each other with the gate electrode 122 disposed therebetween. The data line 141, the source electrode 142 and the drain electrode 143 are formed in the same metal layer where the power supply line 145, the data pad 144 and the second power supply pad 146 are formed in the non-display region.

A passivation layer 151 is formed on the source electrode 142, the drain electrode 143 and a portion of the semiconductor layer 132 which is not covered by the source electrode 142 and the drain electrode 143. Exemplary embodiments of the passivation layer 141 may include silicon nitride ("SiNx"). A contact hole 152 is formed in the passivation layer 151 to expose the drain electrode 143.

A pixel electrode 161 is formed on the passivation layer 151. The pixel electrode 161 is referred to as an anode and provides holes to an organic layer 180. The operation of an organic light emitting diode ("OLED"), including the function of holes therein, will be described in more detail below. Exemplary embodiments of the pixel electrode 161 may be made of a transparent conductive material such as indium tin oxide ("ITO") or indium zinc oxide ("IZO") and connected to the drain electrode 143 through the contact hole 152. In one exemplary embodiment the pixel electrode 161 is formed of the same transparent conductive layer as contact members 162, 163, 165, 166 and 167 and a driving bridge 164 in the non-display region.

A wall 171 is formed on the pixel electrode 161 and the passivation layer 151 wherein the wall 171 surrounds the pixel electrode 161. The wall 171 divides the pixels to define a pixel region. The wall 171 prevents the source electrode 142 and the drain electrode 143 from short-circuiting with the common electrode 190. Exemplary embodiments of the wall 171 may be made of a photoresist material with thermal resistance and solvent resistance such as acrylic resin, polyimide resin, or other similar materials, or an inorganic material such as silicon dioxide ("$SiO_2$"), titanium dioxide ("$TiO_2$"), or other similar materials. Alternative exemplary embodiments include configurations wherein the wall 171 may have a double-layered structure of an organic layer and an inorganic layer.

The organic layer 180 is formed on the portion of the pixel electrode 161 not covered by the wall 171. The organic layer 180 includes a hole injecting layer 181 and a light emitting layer 182. In one exemplary embodiment the organic layer 180 is formed by a wet method such as ink-jetting. Alternative exemplary embodiments include configurations wherein the organic layer 180 may be formed by a dry method such as heat evaporation.

The hole injecting layer 181 may include a hole injecting material such as poly-3,4-ethylenedioxythiophene ("PEDOT"), poly styrenesulfonate acid ("PSS") or other similar material and may be formed by ink-jetting the hole injecting material in an aqueous suspension state.

The light emitting layer 182 may also be formed by ink-jetting.

Holes provided from the pixel electrode 161 and electrons provided from the common electrode 190 are combined into excitons in the light emitting layer 182. Excitons may generate photons in the visible wavelength while de-exciting.

The common electrode 190 is formed on the wall 171 and the light emitting layer 182. The common electrode 190 is referred to as a cathode and provides the electrons to the light emitting layer 182. In one exemplary embodiment the common electrode 190 includes a reflective metal layer. Light emitted from the light emitting layer 182 exits toward the insulating substrate 110.

The sealant 300 is formed along the circumference of the display region and combines the insulating substrate 110 and the encapsulation substrate 200. The encapsulation substrate 200 is provided to prevent the organic layer 180 from being exposed to moisture or oxygen. The encapsulation substrate 200 may further include a moisture absorber (not shown) to protect the organic layer 180 from moisture.

Hereinafter, applying the common voltage and the driving voltage will be described with reference to FIGS. 2 and 7 through 9.

Figure 7:
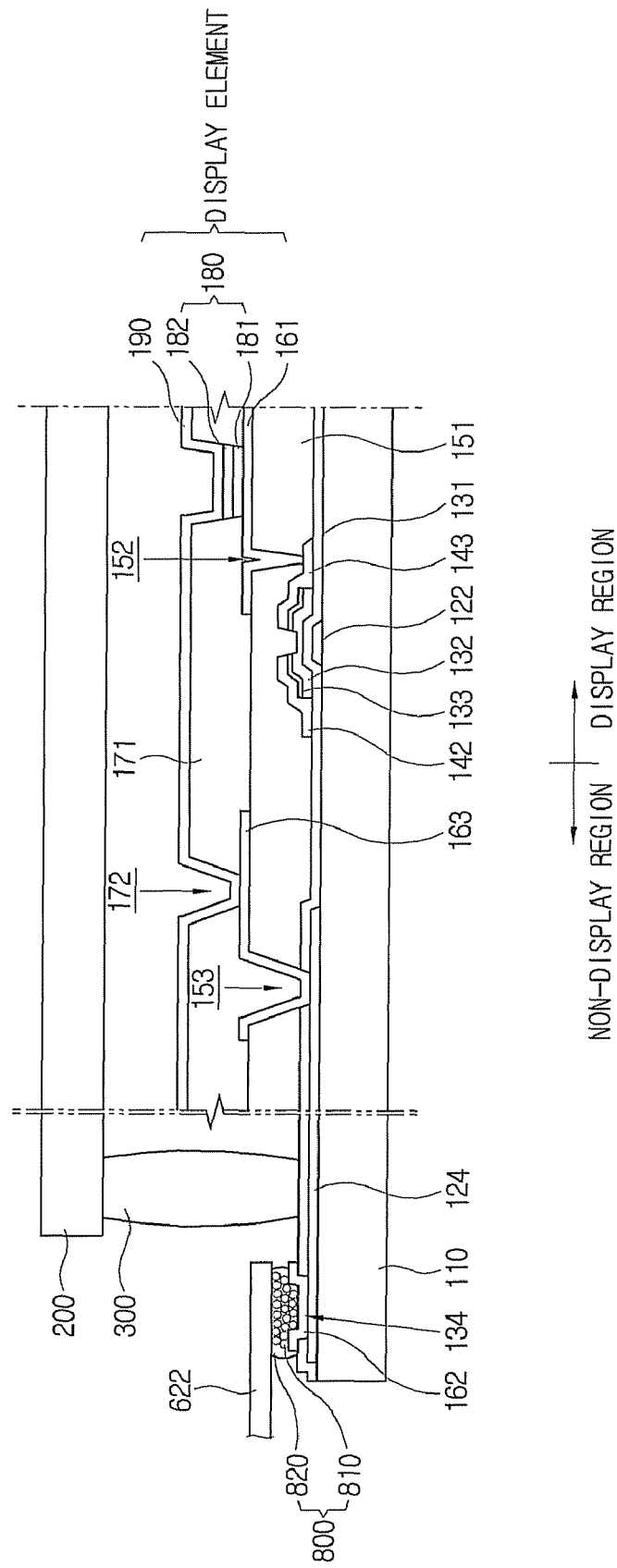
FIG. 7 is a cross-sectional view taken along line VII-VII in FIG. 3.

FIG. 7 illustrates applying the common voltage through the first common voltage pad 124.

The first common voltage pad 124 is exposed through a contact hole 134 formed on the gate insulating layer 131. The first common voltage pad 124 is covered by the contact member 162. The contact member 162 is electrically connected to the common voltage transmitting part 622 through the anisotropic conductive film 800.

The common voltage from the common voltage transmitting part 622 is delivered to the first common voltage pad 124 and applied to the common electrode 190 via the contact member 163.

The contact member 163 is connected to the first common voltage pad 124 through a contact hole 153 and to the common electrode 190 through a contact hole 172.

The first power supply pad 125 and the driving voltage transmitting part 611 are connected through a similar method to that illustrated in FIG. 7, therefore to prevent repetition it is not shown.

Figure 8:
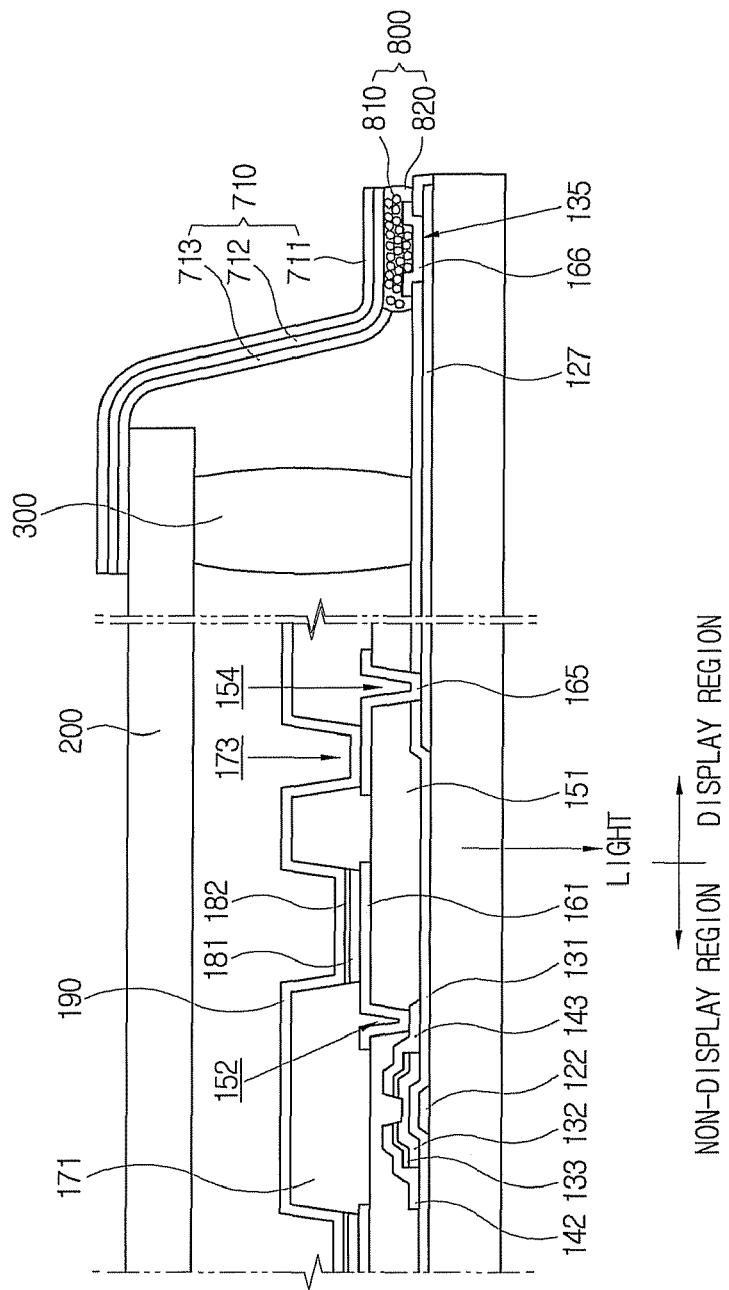
FIG. 8 is a cross-sectional view taken along line VIII-VIII in FIG. 3.

FIG. 8 illustrates applying the common voltage through the second common voltage pad 127.

The second common voltage pad 127 is exposed through a contact hole 135 formed on the gate insulating layer 131. The second common voltage pad 127 is covered by the contact member 166. The contact member 166 is electrically connected to the first flexible member 710 through the anisotropic conductive film 800.

The common voltage from the first flexible member 710 is delivered to the second common voltage pad 127 and applied to the common electrode 190 via the contact member 165.

The contact member 165 is connected to the second common voltage pad 127 through a contact hole 154 and to the common electrode 190 through a contact hole 173.

In the present exemplary embodiment, a portion of the first flexible member 170 extends over the encapsulation substrate 200. In one exemplary embodiment the first flexible member 170 may be formed with a relatively large width for processing convenience.

In the first exemplary embodiment, light from the organic layer 180 exits toward the insulating substrate 110. When light passes through the bottom substrate, in this exemplary embodiment the bottom substrate is the insulating substrate 110, of an OLED display device, that display device is categorized as a bottom-emission type display. Thus, display quality is not affected by the portion of the flexible member 710 which extends over the encapsulation substrate 200. Therefore, the flexible member 710 may extend over the display region as far necessary.

Figure 9:
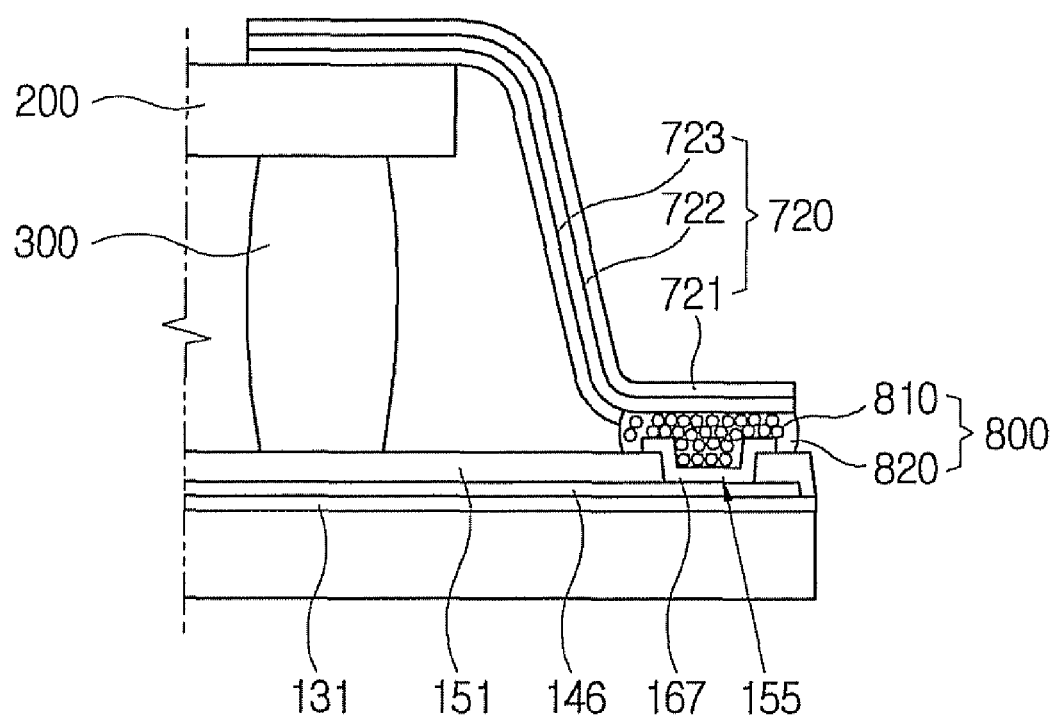
FIG. 9 is a cross-sectional view taken along line IX-IX in FIG. 3.

FIG. 9 illustrates applying the driving voltage through the second power supply pad 146.

The second power supply pad 146 is exposed through a contact hole 155 formed on the gate insulating layer 131 and the passivation layer 151. The second power supply pad 146 is covered by the contact member 167. The contact member 167 is electrically connected to the second flexible member 720 through the anisotropic conductive film 800.

The second flexible member 720 includes a conductive layer 722 and a first and second insulating layers 721 and 723 which are formed on opposite sides of the conductive layer 722, similarly to the first flexible member 710. The second insulating layer 723 is partially removed, or alternately is never formed in certain regions, to expose the conductive layer 722.

The driving voltage from the second flexible member 720 is delivered to the second power supply pad 146. In one exemplary embodiment the second power supply pad 146 is formed in a single body with the power supply line 145, and the driving voltage from the second power supply pad 146 is delivered to the power supply line 145.

In the present exemplary embodiment, a portion of the second flexible member 720 extends over the encapsulation substrate 200.

Connections between the reference voltage pad and the common electrode, the reference voltage pad and the power supply line and configurations of the reference voltage pad which are described in the first exemplary embodiment may be variously modified. The reference voltage pad in the present invention comprises a component which extends outside the display region to receive the common voltage and/or the driving voltage. For example, if the common electrode 190 extends outside the display region to receive the common voltage, the common electrode 190 disposed in the non-display region may function as a reference voltage pad.

According to the first exemplary embodiment, the display device 1 has a simple configuration and efficiently provides the driving voltage and the common voltage, which will be described below.

Referring to FIGS. 2, 3 and 7, in the first exemplary embodiment, the common voltage is provided through the common voltage transmitting part 622 at the third side 110c of the display device 1 and through the first flexible member 710 at the second side 110b of the display device 1. The driving voltage is provided through the driving voltage transmitting part 611 at the first side 110a of the display device 1 and the second flexible member 720 at the fourth side 110d of the display device 1. Thus, the common voltage is provided from opposite sides of the common electrode 190, e.g., both the right and the left sides, at the same time, so that the display element may be provided with the uniform common voltage throughout the display area. Similarly, the driving voltage is provided from opposite sides of the power supply line 145, e.g., both the up and the down sides, at the same time, so that the display element may be provided with the uniform driving voltage throughout the display area.

In one exemplary embodiment the first flexible member 710 is formed to be longer than the second side 110b and covers the entire second common voltage pad 127. The portion of the first flexible member 710 which is connected to the second common voltage pad 127 is provided as one body, thereby simplifying the configuration of the display device 1.

In one exemplary embodiment the second flexible member 720 is formed longer than the fourth side 110d and covers the entire second power supply pad 146. The portion of the second flexible member 720 which is connected to the second power supply pad 146 is provided as one body, thereby simplifying the configuration of the display device 1.

In one exemplary embodiment the data driver 400 and the gate driver 500 may be bent to face the encapsulation substrate 200, thereby decreasing an overall size of the display device 1 and allowing the display device 1 to fit in a smaller receiving container. In such an exemplary embodiment, the first flexible member 710 and the second flexible member 720 do not protrude outside the insulating substrate 110, thereby simplifying the configuration of the display device 1.

The first flexible member 710 receives the common voltage through the data circuit board 430, and the second flexible member 720 receives the driving voltage through the gate circuit board 530. Thus, an additional circuit board is not necessary to apply the common voltage or the driving voltage, thereby further simplifying the configuration of the display device 1.

Figure 10:
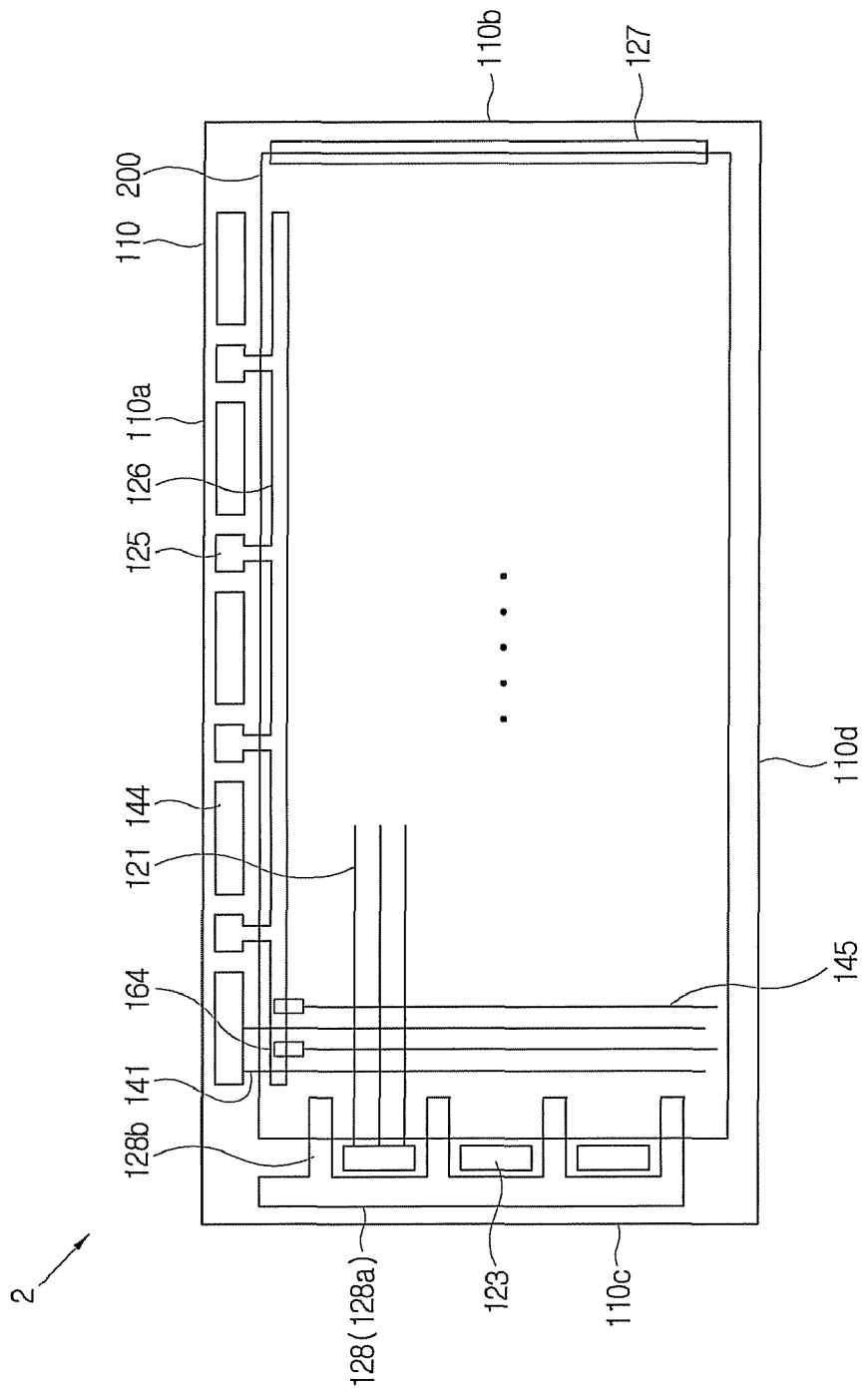
FIGS. 10 and 11 are top plan layout views of a second exemplary embodiment of a display device according to the present invention.
Figure 11:
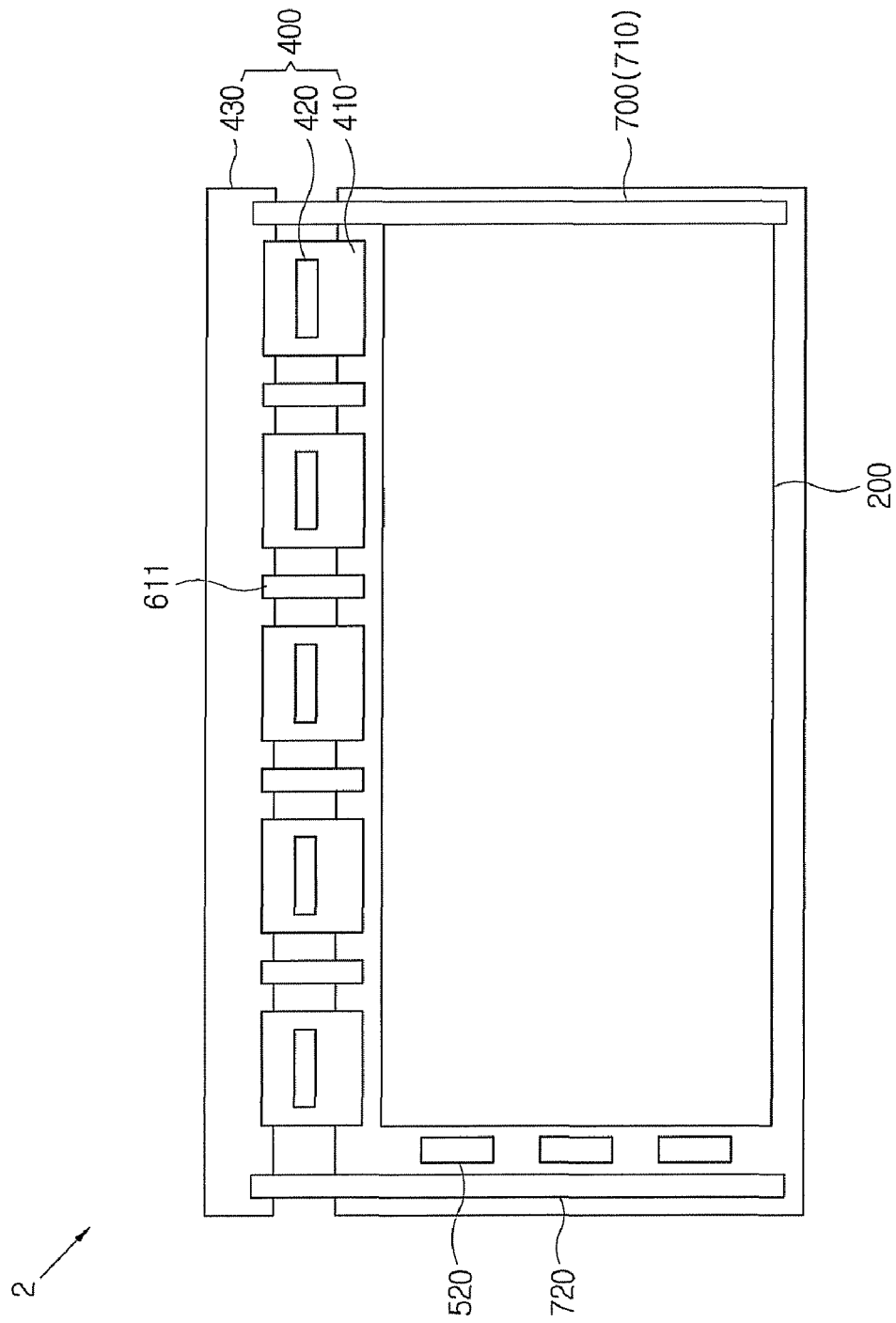

Hereinafter, a second exemplary embodiment of a display device according to the present invention will be described with reference to FIGS. 10 and 11. For clarity a data driver 400, a gate driving chip 520, a first flexible member 710 and a second flexible member 720 are illustrated in FIG. 11, but not in FIG. 10. Sides of the display device 2 are labeled similarly to the sides of the display device 1; the display device 2 has a first side 110a, a second side 110b, a third side 110c and a fourth side 110d.

A second common voltage pad 127 is provided in a right region of a non-display region located along the second side 110b. A third common voltage pad 128 is provided in a left region of the non-display region located along the third side 110c.

The third common voltage pad 128 includes a contact part 128a and an extending part 128b. The contact part 128a extends lengthwise along the third side 110c and is connected to the second flexible member 720. The extending part 128b extends from the contact part 28a toward a display region and is disposed between gate pads 123.

In the second exemplary embodiment, as opposed to the first exemplary embodiment, a gate circuit board 530 is not provided, and a gate driving chip 520 is seated directly on an insulating substrate 110. A wire (not shown) is formed on the insulating substrate 110 to deliver a control signal from the data driver 400 to the gate driving chip 520.

Both the first flexible member 710 and the second flexible member 720 are connected to a driving circuit board 430. The first flexible member 710 is connected to a right end portion of the data circuit board 430, and the second flexible member 720 is connected to a left end portion of the data circuit board 430.

In one exemplary embodiment the first flexible member 710 and the second flexible member 720 apply a common voltage to the second common voltage pad 127 and the third common voltage pad 128, respectively. In an alternative exemplary embodiment one of the first flexible member 710 and the second flexible member 720 apply the common voltage, and the other flexible member may apply a driving voltage.

In the second exemplary embodiment, the gate circuit board is not provided, thereby simplifying the configuration of a display device 2.

In exemplary embodiments of the present invention, the configuration of a flexible member 700 may be variously modified, which will be described in the following third to fifth exemplary embodiments.

Figure 12:
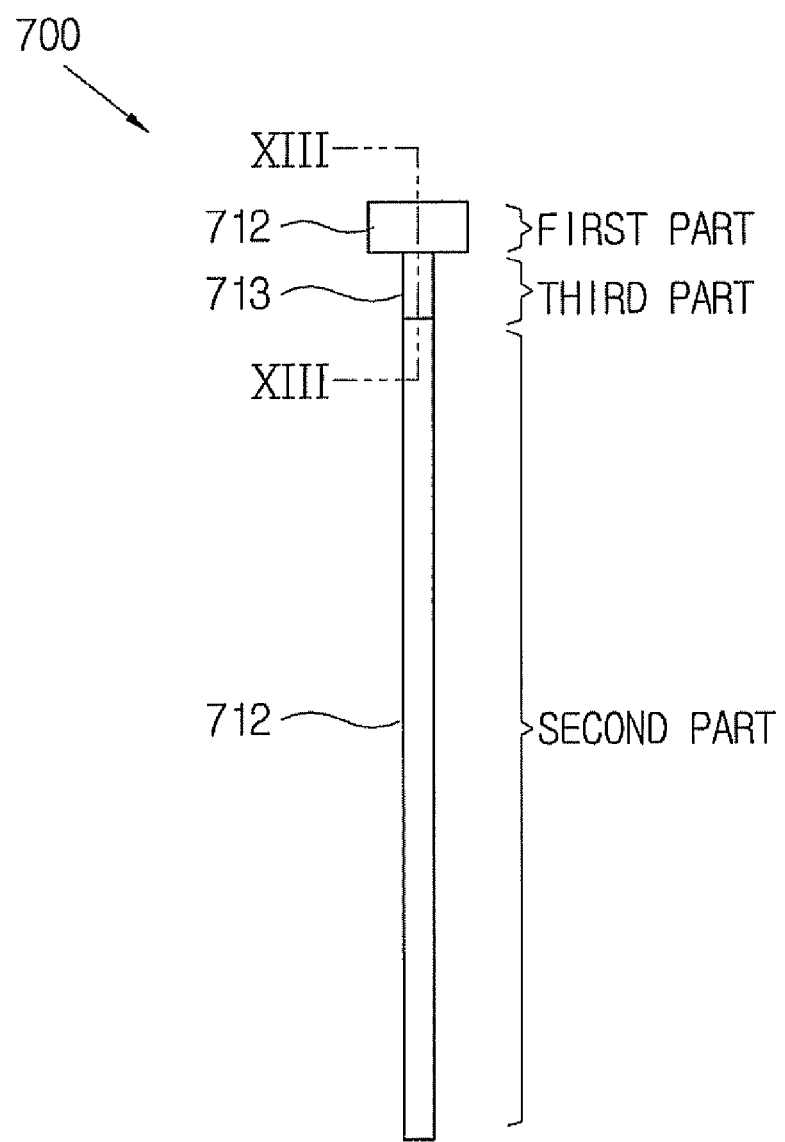
FIG. 12 is a rear view of an exemplary embodiment of a flexible member in third exemplary embodiment of a display device according to the present invention.
Figure 13:
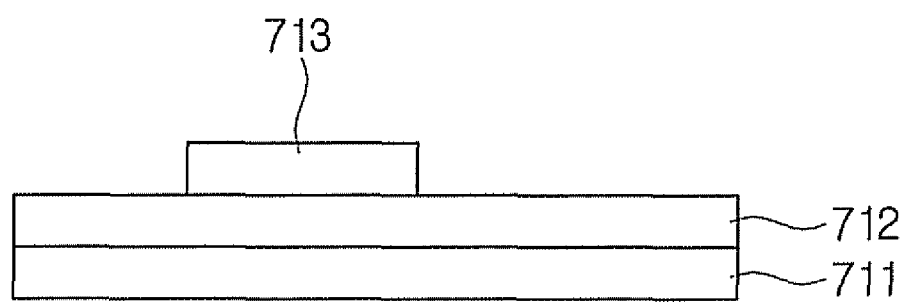
FIG. 13 is a cross-sectional view taken along line XIII-XIII in FIG. 12.

According to a third exemplary embodiment with reference to FIGS. 12 and 13, a second insulating layer 713 is not formed in, or is removed from, a first part and a second part of the flexible member 700. That is, a conductive layer 712 of the flexible member 700 is exposed throughout the first part and the second part.

In the third exemplary embodiment, the flexible member 700 does not extend over an encapsulation substrate 200, thereby simplifying the configuration of a display device 1.

Figure 14:
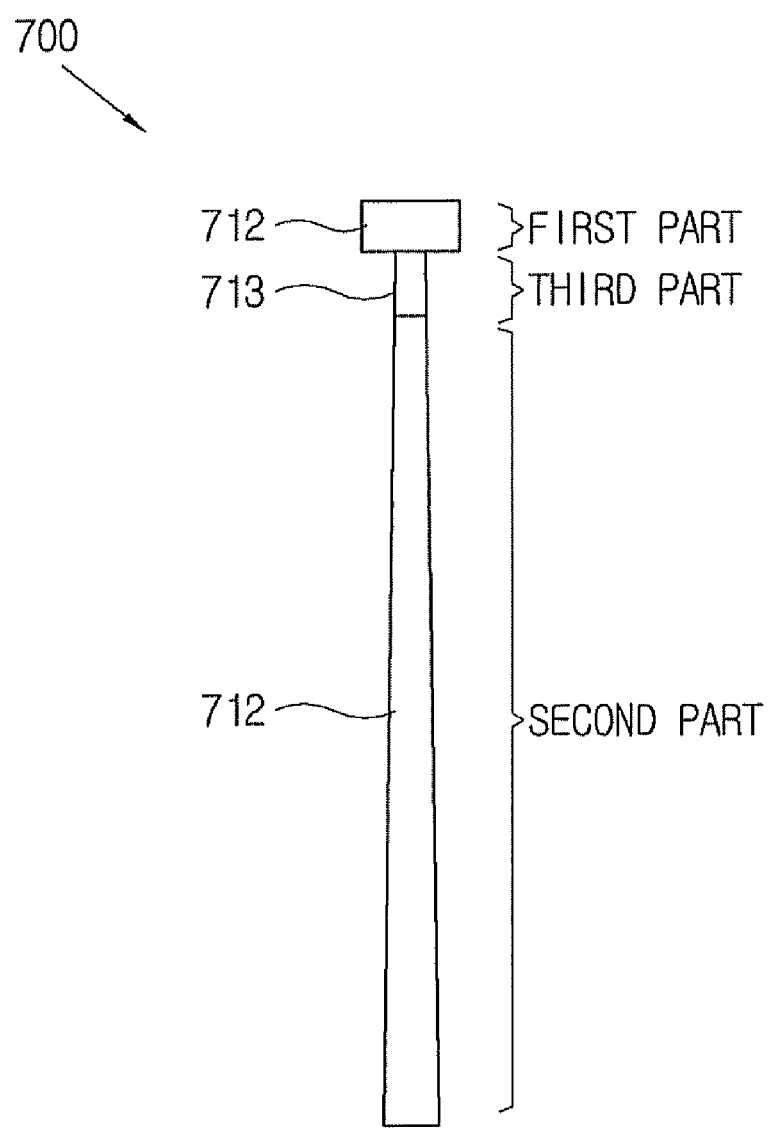
FIG. 14 is a rear view of an exemplary embodiment of a flexible member in a fourth exemplary embodiment of a display device according to the present invention.

According to a fourth exemplary embodiment with reference to FIG. 14, the flexible member 700 includes a first part, a second part and a third part. The second part of the flexible member 700 increases in width with distance from the first part thereof. In the present exemplary embodiment, similar to the third exemplary embodiment, the second insulating layer 713 is not formed in, or is removed from, the first part and the second part.

As a reference voltage is applied through the first part, a voltage drop is generated in a spot far from the first part. If the voltage drop is generated, it is difficult to maintain the reference voltage applied to the second part uniformly. In the fourth exemplary embodiment, resistance decreases with distance from the first part due to the second part becoming wider with distance from the first part. Thus, the reference voltage may be maintained uniformly throughout the second part.

In an alternative exemplary embodiment, a contacting area between the flexible member 700 and reference voltage pads 127 and 146 may be made to increase with distance from the first part.

Figure 15:
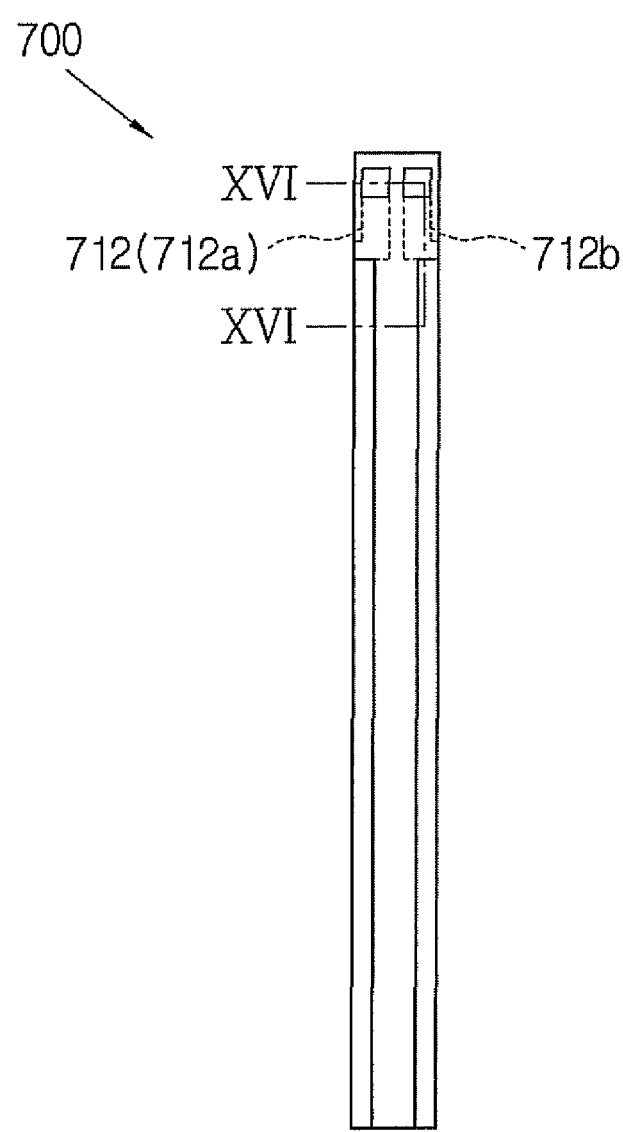
FIG. 15 is a rear view of an exemplary embodiment of a flexible member in fifth exemplary embodiment of a display device according to the present invention.
Figure 16:
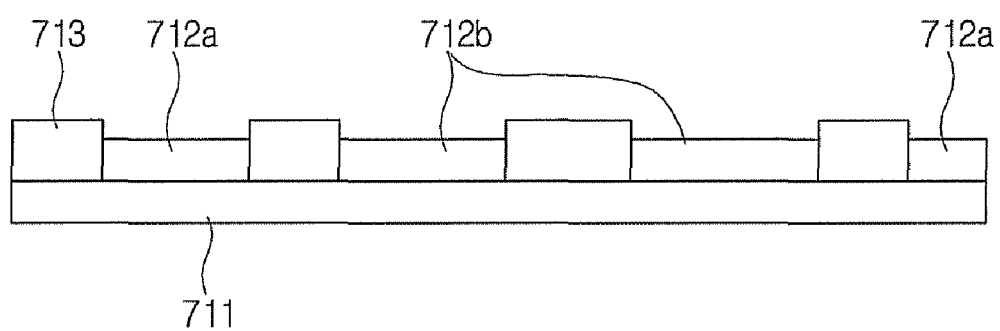
FIG. 16 is a cross-sectional view taken along line XVI-XVI in FIG. 12.

According to the fifth exemplary embodiment with reference to FIGS. 15 and 16, a conductive layer 712 includes a first conductive layer 712a and a second conductive layer 712b which are electrically insulated from each other.

The first conductive layer 712a and the second conductive layer 712b are connected through circuit boards 430 and 530 and reference voltage pads 127 and 146. One of the first conductive layer 712a and the second conductive layer 712b may apply a driving voltage to the reference voltage pads 127 and 146, and the other thereof may apply a common voltage to the reference voltage pads 127 and 146. In such an exemplary embodiment, the configuration of the reference voltage pads 127 and 146 is modified corresponding to a flexible member 700.

Display devices 1 and 2 as described above are of the bottom-emission type, in which light from a light emitting layer 182 exits toward an insulating substrate 110. Alternatively, the display devices 1 and 2 may be top-emission type, in which light from the light emitting layer 182 exits toward an encapsulation substrate 200, which will be described in a sixth exemplary embodiment.

Figure 17:
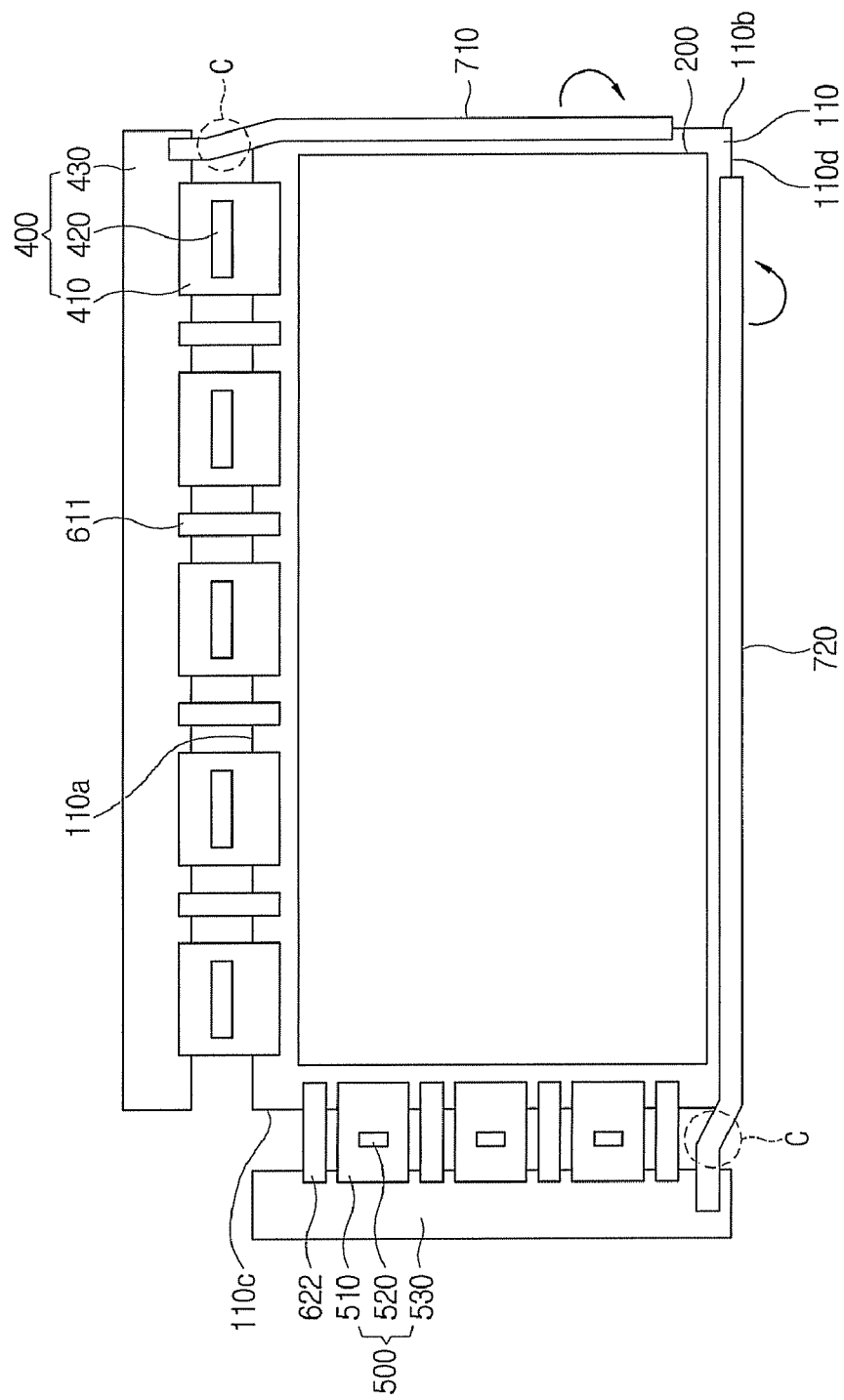
FIG. 17 is a top plan layout view of a sixth exemplary embodiment of a display device according to the present invention.

According to the sixth exemplary embodiment with reference to FIG. 17, a portion of a first flexible member 710 extends over a first side 110a of the insulating substrate 110 and a portion of a second flexible member 720 extends over a third side 110c of the insulating substrate 110. In contrast to the previous exemplary embodiments, a data circuit board 430 does not extend over a first side 110a of the insulating substrate 110, and a gate circuit board 530 does not extend over a third side 110c of the insulating substrate 110. Thus, the first flexible member 710 and the second flexible member 720 each include a part C which is bent to be connected with the insulating substrate 110.

Meanwhile, the first flexible member 710 and the second flexible member 720 do not extend to an encapsulation substrate 200, because the light from the light emitting layer 182 exits through the encapsulation substrate 200. Therefore, the flexible members 710 and 720 do not block the light emitting through the encapsulation substrate 200.

To decrease the overall size of the display device 1, the first flexible member 710 and the second flexible member 720 extending outside the insulating substrate 110 are bent to be disposed behind the insulating substrate 110 as demonstrated by the directional arrows.

As described above, the present invention provides a display device with a simple configuration to apply a reference voltage to a display element.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display device comprising:
   an insulating substrate;
   a display element which defines a display region and includes an organic light emitting layer which is formed on the insulating substrate;
   a first circuit board disposed parallel with a first side of the insulating substrate;
   a reference voltage pad formed on a circumference of the display region and which is electrically connected to the display element;
   a first flexible member comprising a first part which adheres to the first circuit board and a second part connected to the reference voltage pad along a second side of the face of the insulating substrate; and
   a first driving chip electrically connected between the first circuit board and the display element,
   wherein the first flexible member provides a reference voltage to the display element without any intervening chip.

2. The display device according to claim 1, wherein the first side and the second side are substantially perpendicular to each other.

3. The display device according to claim 2, wherein the first flexible member is longer than the second side.

4. The display device according to claim 1, wherein the first side is longer than the second side.

5. The display device according to claim 1, wherein the flexible member receives the reference voltage from the first circuit board.

6. The display device according to claim 1, further comprising:
   a second circuit board disposed parallel with a third side of the insulating substrate which is disposed opposite to the second side of the insulating substrate; and
   a second flexible member comprising a third part which adheres to the second circuit board and a fourth part connected to the reference voltage pad along a fourth side of the insulating substrate which is opposite to the first side of the insulating substrate.

7. The display device according to claim 6, wherein the reference voltage comprises a common voltage and a driving voltage,
   the first flexible member applies one of the common voltage and the driving voltage to the reference voltage pad, and
   the second flexible member applies the other of the common voltage and the driving voltage to the reference voltage pad.

8. The display device according to claim 1, wherein the first flexible member comprises a first sub-flexible member and a second sub-flexible member which are connected to the first circuit board, respectively.

9. The display device according to claim 8, wherein the first sub-flexible member is connected to a first end portion of the first circuit board, and the second sub-flexible member is connected to a second end portion of the first circuit board.

10. The display device according to claim 8, wherein the first sub-flexible member and the second sub-flexible member are disposed opposite to each other with the display region disposed therebetween.

11. The display device according to claim 8, wherein the reference voltage comprises a common voltage and a driving voltage,
the first sub-flexible member applies one of the common voltage and the driving voltage to the reference voltage pad, and
the second sub-flexible member applies the other of the common voltage and the driving voltage to the reference voltage pad.

12. The display device according to claim 1, wherein the first flexible member comprises:
a conductive layer;
a first insulating layer formed on a first surface of the conductive layer; and
a second insulating layer formed on a second surface of the conductive layer,
wherein a gap is formed in one of the first insulating layer and the second insulating layer whereby the first circuit board and the reference voltage pad are connected therethrough.

13. The display device according to claim 1, wherein the first flexible member comprises:
a conductive layer;
a first insulating layer formed on a first surface of the conductive layer; and
a second insulating layer formed on a second surface of the conductive layer,
at least one of the first part and the second part not being formed with one of the first insulating layer and the second insulating layer.

14. The display device according to claim 1, wherein a contact area between the second part of the first flexible member and the reference voltage pad increases with distance from the first part of the first flexible member.

15. The display device according to claim 1, wherein the first flexible member includes a first conductive layer and a second conductive layer which are electrically insulated from each other.

16. The display device according to claim 15, wherein a reference voltage comprises a common voltage and a driving voltage,
the first conductive layer applies one of the common voltage and the driving voltage to the reference voltage pad, and
the second conductive layer applies the other of the common voltage and the driving voltage to the reference voltage pad.

17. The display device according to claim 1, further comprising an encapsulation member formed on the display element, wherein a portion of the second part of the first flexible member is disposed on the encapsulation member.

18. The display device according to claim 17, wherein a light generated in the display element exits toward the insulating substrate.

19. The display device according to claim 1, wherein a light generated in the display element exits in a direction substantially opposite to the insulating substrate, and the second part of the first flexible member is bent in a direction substantially opposite to the exiting direction of light.

20. The display device according to claim 1, further comprising an anisotropic conductive film disposed between the first part of the first flexible member and the first circuit board and between the second part of the first flexible member and the reference voltage pad.

21. The display device according to claim 1, further comprising a film member, wherein a first side of the film member is connected to the insulating substrate and a second side of the film member is connected to the circuit board.

22. A display device comprising:
an insulating substrate;
a display element formed on the insulating substrate;
a circuit board disposed parallel with a first side of the insulating substrate;
an encapsulation substrate covering the display element; and
a flexible member comprising a first part which receives a reference voltage from the circuit board and a second part which extends along a second side of the insulating substrate and which supplies the reference voltage to the display element,
wherein the first flexible member is extended over the encapsulation substrate.

23. The display device according to claim 22, wherein the first side and the second side are substantially perpendicular to each other.

24. The display device according to claim 22, wherein the flexible member is longer than the second side.

25. A display device comprising:
an insulating substrate;
a display element formed on the insulating substrate which defines a display region;
a reference voltage pad formed on a circumference of the display region and electrically connected to the display element;
an encapsulation substrate covering the display element, and
a flexible member which extends along a first side of the insulating substrate, is connected to the reference voltage pad to apply a reference voltage to the reference voltage pad, and is longer than the first side,
wherein the first flexible member is extended over the encapsulation substrate.

26. The display device according to claim 25, further comprising a circuit board disposed parallel with a second side of the insulating substrate, wherein a portion of the flexible member is connected to the circuit board and the flexible member receives the reference voltage from the circuit board.

27. The display device according to claim 26, wherein the first side and the second side of the insulating substrate are substantially perpendicular to each other.

* * * * *